United States Patent [19]

Pierce et al.

[11] 4,385,979

[45] May 31, 1983

[54] TARGET ASSEMBLIES OF SPECIAL MATERIALS FOR USE IN SPUTTER COATING APPARATUS

[75] Inventors: Danny A. Pierce, Columbus; Joseph A. Heisler, Timberlake; Roger D. Self, Mount Sterling, all of Ohio

[73] Assignee: Varian Associates, Inc., Palo Alto, Calif.

[21] Appl. No.: 396,580

[22] Filed: Jul. 9, 1982

[51] Int. Cl.$^3$ .............................................. C23C 15/00
[52] U.S. Cl. .................................................. 204/298
[58] Field of Search ........................................ 204/298

[56] References Cited

U.S. PATENT DOCUMENTS

| | | | |
|---|---|---|---|
| 3,750,623 | 8/1973 | Carpenter | 204/298 |
| 3,878,085 | 4/1975 | Corbani | 204/298 |
| 4,009,090 | 2/1977 | Veigel | 204/192 |
| 4,038,171 | 7/1977 | Moss et al. | 204/298 |
| 4,100,055 | 7/1978 | Rainey | 204/298 |
| 4,169,031 | 9/1979 | Brors | 204/298 |
| 4,198,283 | 4/1980 | Class et al. | 204/298 |
| 4,219,397 | 8/1980 | Clarke | 204/298 |

OTHER PUBLICATIONS

J. L. Vossen and W. Kern, "Thin Film Processes", 1978, pp. 31–33, 41–42 and 138–141, Academic Press, New York.

J. van Esdonk and J. F. M. Janssen, "Joining a Sputtering Target and a Backing Plate", Jan. 1975, pp. 41–44, Research/Development.

*Primary Examiner*—Arthur P. Demers
*Attorney, Agent, or Firm*—Stanley Z. Cole; Leon F. Herbert; Robert L. Jepsen

[57] ABSTRACT

In high rate sputter coating sources, it is generally necessary to liquid cool the sputter targets. In one type of source, a cooled wall of a cathode assembly is closely adjacent a sidewall of the sputter target. During normal operation the sidewall of the target expands thermally into tight contact with the cooled wall, whereby cooling of the target is effected without the need for bonding the target to the cooled wall using a solder or other adhesive. Thus, replacement of worn conventional targets is a relatively simple procedure. When the targets are made of certain special materials, such as fragile materials or materials with low coefficients of thermal expansion, target warping, cracking or melting can occur. Such problems are overcome or alleviated by the novel design approach of the present invention, which employs a sputter target assembly in place of a conventional target. The novel sputter target assembly comprises a sputter target of the special material, a retaining member, and a bonding means between the special sputter target and the retaining member. When the special target is worn out, the sputter target assembly is replaced with the same simple procedure used for a conventional target.

13 Claims, 11 Drawing Figures

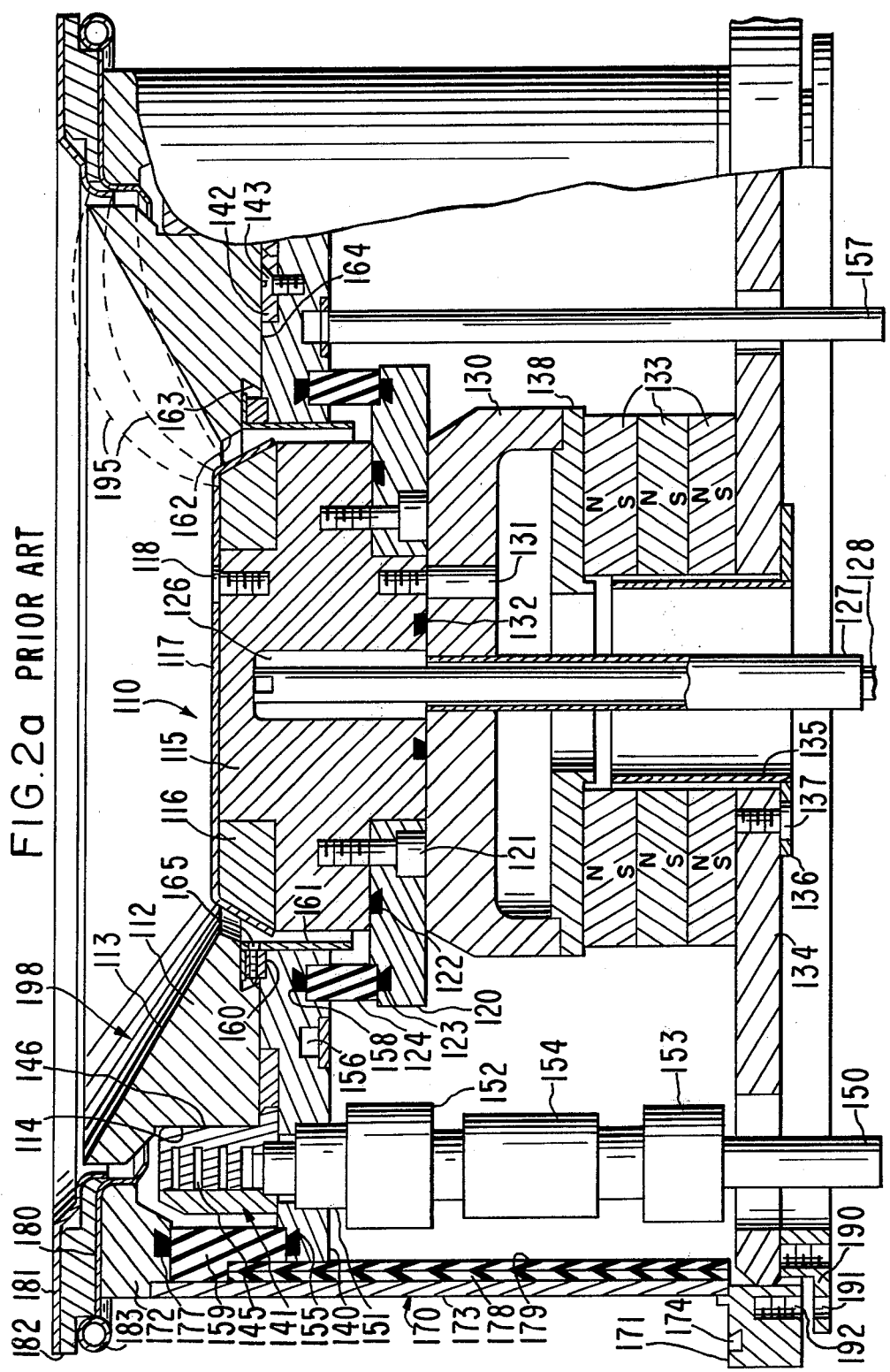

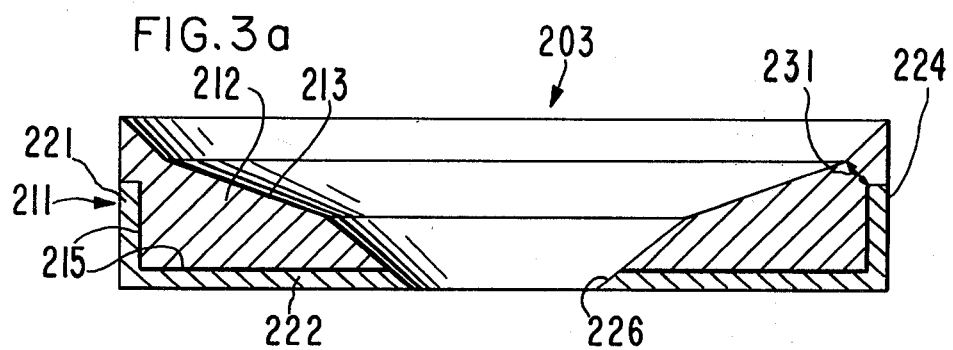
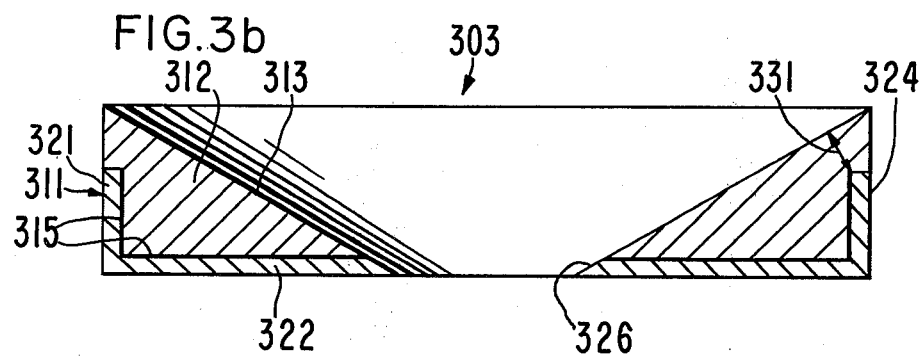
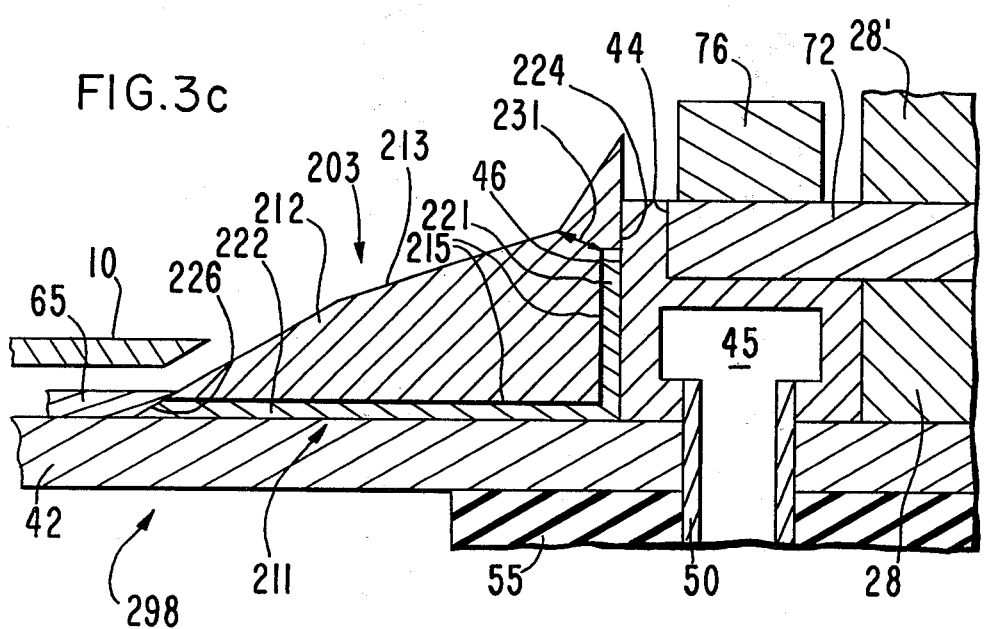

TARGET ASSEMBLIES OF SPECIAL MATERIALS FOR USE IN SPUTTER COATING APPARATUS

DESCRIPTION

1. Field of the Invention

This invention is in the field of vacuum sputter coating apparatus and particularly relates to sputter targets or target assemblies for use in sputter coating sources wherein the targets or target assemblies are cooled by expanding thermally into tight contact with mating cooled surfaces of the sputter coating sources.

2. Background of the Invention

Vacuum deposition of coatings using cathode sputtering induced by glow discharges is currently in widespread use. Sputter coating sources include cathode and anode structures, and are operated in an evacuated chamber back-filled with a sputter gas (typically argon at subatmospheric pressure). Positive ions formed in the space between anode and cathode impact a target located on the cathode surface, ejecting (by sputtering) atoms of target material from the surface and near subsurface atomic layers of the target. These sputtered atoms deposit on workpieces or substrates placed generally in line of sight of the target. Magnetron sputter coating sources employ magnetic fields crossed with electric fields in the vicinity of the target. The use of such magnetic fields can enhance glow discharge intensities and the attendant sputtering rates, extend operation to lower sputter gas pressures, confine the glow discharge to the neighborhood of the electrodes, and reduce electron bombardment of the substrates.

In sputter coating sources the majority of the electrical energy used to induce sputtering is converted into heat near the surface of the sputter target. For high sputtering rates it is generally necessary to liquid cool the targets (usually with water). A first type of prior art sputter coating source employs a cathode assembly in which the back side of a planar target is bonded to a cooled planar wall or backing plate. Bonding is usually effected by means of a compatible thermally conductive adhesive, including metal alloy solders and thermally conductive epoxies. See, for example, *Thin Film Processes*, edited by J. L. Vossen and W. Kern, Academic Press, New York, 1978, especially pp. 31-33 and pp. 41-42 by J. L. Vossen and J. J. Cuomo, and pp. 138-141 by R. K. Waits. See also J. van Esdonk and J. F. M. Janssen, "Joining A Sputtering Target And A Backing Plate," *Research/Development, January* 1975, pp. 41-44. A disadvantage of the first type of sputter coating source as described above is that after the target has been sputtered to the end of its useful life it is usually necessary to remove the entire cathode assembly and return it to the manufacturer for removal of the spent target and for bonding of a new target to the backing plate.

Another prior art planar sputter coating source is described in U.S. Pat. No. 4,009,090 to Veigel. In this patent, coating material (target) 73 is applied to support (backing) plate 74 by electroplating, brazing, or in some other suitable manner. Support plate 74 is secured to bottom wall 51 of the liquid (oil)-cooled cathode housing by means of bolts 76. A thin foil sheet 75 of a soft, thermally conductive material, such as aluminum or indium, is sandwiched between bottom wall 51 and support plate 74. Target replacement in this case is simplified over the situation described in the preceding paragraph in that it is unnecessary to remove the entire cathode assembly; the cathode housing remains in place when target 73 bonded to support plate 74 is removed.

A second type of prior art sputter coating source involves a cathode assembly having a cooled wall with a surface closely adjacent a side wall of the target so that as the target expands upon being heated during normal operation the side wall of the target makes intimate thermal contact with the cooled wall. In this arrangement no bonding is required between the cooled wall of the cathode assembly and the target, which greatly simplifies and expedites the attachment and removal of targets to and from the sputter coating source. However, the second type of sputter coating source experiences problems when the target is made of materials which are "special" in respect to one or more such physical properties as coefficient of thermal expansion, mechanical strength, and brittleness. For example, a target material having a too-low thermal expansion coefficient will not expand into highly compressed contact with the cooled wall of the cathode assembly. Overheating of the target can then occur, leading to warping, cracking, or even melting. A target made of material having a too-high coefficient of thermal expansion, on the other hand, may be damaged because of excessive compressive forces developed during thermal expansion of the sidewall of the target against the cooled wall of the cathode assembly. Alternatively, the cooled wall may be damaged if the target material is sufficiently strong. Special materials of particular interest include the so-called "fragile" materials such as silicon, germanium, some inorganic compounds, some powdered metals, and similar types of materials. The problems arise primarily as a result of the very mechanism which provides the normally desirable features of the second type of sputter coating source, namely, the need for thermal expansion of the target into highly compressed contact with the cooled wall of the cathode assembly. When targets of fragile materials are used in the second type of coating source, which relies on target expansion for cooling, it has been found that the targets tend to warp and/or crack and/or fail to make sufficient thermal contact with the cooled wall of the cathode assembly and thus overheat. Warping normally results in inconsistent operation of the sputter coating source or even nonoperation. Cracking of the target can result in pieces of the target falling out of the sputter coating source, which may result in terminating operation and which also can damage or contaminate the sputter coating system. Overheating can be catastrophic in the sense of causing the target to melt.

The mechanics which cause the above problems with special target materials are complex. Some of the causes are, for example, stresses inherent in the target as a result of the manufacturing processes, which cause warping and/or cracking during thermal expansion and contraction; particular grain orientations which cause expansion and contraction predominantly along particular directions rather than uniformly; unstable crystal formation; the fact that targets of some materials will not expand sufficiently to make the necessary thermal contact with the cooled wall of the cathode assembly; and the fact that targets of some materials which do expand sufficiently will undergo stresses (basically in tension) due to the initial expansion and resulting increase in the outer circumference of the target and/or stresses (basically in compression) due to the confining effect of the cooled wall of the cathode assembly once the target periphery contacts the cooled wall so that further expansion forces are translated into compressive forces.

A first example of the second type of source is the magnetron sputter coating source described in U.S. Pat. No. 4,100,055, issued July 11, 1978 to Robert M. Rainey and entitled "Target Profile For Sputtering Apparatus" and assigned to the assignee of the present invention. A second example of the second type of sputter coating source is described in detail in co-pending application U.S. Ser. No. 150,532 filed May 16, 1980 in the name of Lawrence T. Lamont, Jr., and entitled "Magnetically Enhanced Sputter Source" and assigned to the assignee of the present invention. Both of the above sputter coating sources are commercially available from and manufactured by Varian Associates, Inc. under the respective trademarks "S-Gun" and "Conmag".

Each of the above sources has heretofore been used with a conventional (non-special) sputter target of an annular configuration surrounding an axially symmetric central anode. The target in turn is surrounded by a cooled wall of the cathode assembly. As mentioned previously herein, the electrical energy used to induce sputtering results in heating of the sputter target during normal operation. Upon being thus heated during normal operation, the target expands against the cooled wall, making intimate thermal contact therewith, whereby cooling of the target is effected.

A third example of the second type of source is the planar magnetron sputter coating source described in U.S. Pat. No. 4,198,283 to Class et al. In this patent, magnetic pole pieces 44 and 47 are bonded (by brazing, for example) to water cooled backing plate 37, whereby the side walls of pole pieces become cooled walls of the cathode assembly. Target bars 45 and 46 are not bonded to backing plate 37. Rather, the target bars and the pole pieces are so dimensioned that the target bars fit snugly between the pole pieces, without being bonded thereto. Upon being heated during normal operation, the target bars expand thermally against the cooled walls of the pole pieces, whereby cooling of the target bars is effected. Since target bars 45 and 46 are not bonded to backing plate 37 nor to pole pieces 44 and 47, they can be removed when replacement becomes necessary, without having to send the entire cathode assembly back to the manufacturer.

A fourth example of the second type of source is a magnetron sputter coating source employing a cylindrical cathode, as described in U.S. Pat. No. 3,878,085 to Corbani. Outer wall 58 of cathode (target) 55 fits tightly into cooled cathode support 59. When the target becomes heated during normal operation, it expands into a tighter fit with the cooled wall of the cathode assembly whereby cooling of the cathode is effected.

The present invention relates to a sputter target for use in the second type of sputter coating source when it is desired to sputter from targets made of fragile or other special target materials.

Accordingly, it is an object of the invention to provide improved sputter targets containing fragile or other special target materials for use in a sputter coating source of the second type, the improvement being that the warping, cracking and/or overheating problems discussed above are avoided or substantially reduced.

It is a further object of the invention that bonding of the above sputter target to the cooling wall of the sputter coating source is avoided whereby target replacement is facilitated.

Yet another object of the invention is to provide for the capture and retention of fragments of fragile target material which may arise from target cracking.

A further object of the invention is to provide a sputter target which can withstand handling and shipping with reduced likelihood of damage to fragile target material.

Another object of the invention is to provide a sputter target which can be secured adjacent the cooled wall of the cathode assembly without damage to the fragile target material by the securing means.

SUMMARY OF THE INVENTION

The novel design approach of the present invention employs a sputter target assembly comprising a fragile or other special target material to be sputtered, and a retaining member. In one embodiment, the retaining member is a cup which generally contains a fragile target material, and a bonding means between the fragile target material and the retaining cup. The retaining cup includes a side wall to interface with a cooled wall of a cathode assembly of a sputter coating source. In another embodiment, the retaining member consists solely of a band or ring around a special target material, again with a bonding means between the special target material and the retaining band. The bonding means serves to provide good thermal conductivity between the special target material and the retaining member. In a number of embodiments of the bonding means, such means also serves to secure the fragile target material to the retaining member.

The retaining member is made of a material having both good thermal conductivity and a sufficiently high coefficient of thermal expansion that the retaining member expands to make intimate thermal contact with the cooled wall of the cathode assembly upon being heated during normal operation of the sputter coating source. Copper is typically, though not exclusively, the material of choice for the retaining member. In addition to its other functions, the bonding means accommodates the coefficient of thermal expansion differences between the special target material and the retaining member.

The retaining member is configured to provide the interface between the special target material and the cooled wall portion of the cathode assembly. In the case of fragile target materials, attachment stresses are assigned primarily to the retaining member rather than to the fragile target material.

To avoid contamination of the sputtered coatings, sputtering of the retaining member material is to be avoided. The retaining member is therefore preferably configured to eliminate peripheral surfaces which might be subject to sputtering. If, for some reason, such peripheral surfaces are required, sputtering from them may be avoided through the judicious use of sputter shields. Also, in sputter coating sources of the second type where the magnetic field is such that sputtering will not occur at the edges of the target, the retaining member can be coextensive with the surfaces of the sputter target without the need for shielding. Additionally, the retaining member is configured to impose minimal limitations upon the useful life of the sputter target of special material. In particular, the retaining member is made as thin as practical in regions of high target erosion.

BRIEF DESCRIPTION OF THE DRAWINGS

FIG. 2a is a partial section of a second example of a prior art sputter coating source of the second type incorporating a conventional sputter target.

FIG. 3a is a section of one embodiment of a sputter target assembly of the present invention for use in the sputter coating source of FIG. 1a.

FIG. 3b is a section of an alternative embodiment of the sputter target assembly of the present invention for use in the sputter coating source of FIG. 1a.

FIG. 3c is an enlarged fragmentary section of the target assembly of FIG. 3a incorporated in the sputter coating source of FIG. 1a.

FIG. 4a is a section of one embodiment of a sputter target assembly of the present invention for use in the sputter coating source of FIG. 2a.

FIG. 4b is an enlarged fragmentary section of the target assembly of FIG. 4a incorporated in the sputter coating source of FIG. 2a.

FIG. 5 is a section of another embodiment of a sputter target assembly of the present invention for use in the sputter coating source of FIG. 1a.

FIG. 6 is a section of another embodiment of a sputter target assembly of the present invention for use in the sputter coating source of FIG. 2a.

DETAILED DESCRIPTION

Figure 1A:
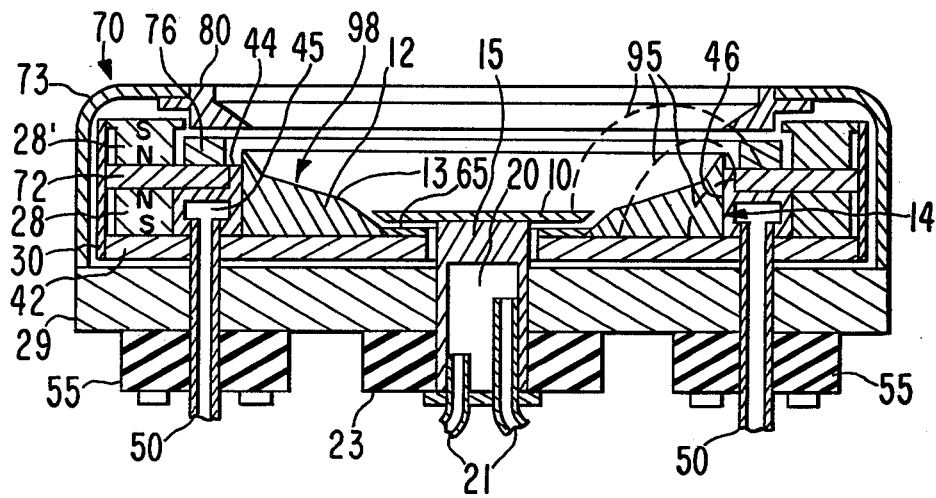
FIG. 1a is a section of a first example of a prior art sputter coating source of the second type incorporating a conventional sputter target.

The present invention is described in the context of the sputter coating sources of FIGS. 1a and 2a. FIG. 1a is a section of said first example of a prior art sputter coating source of the second type (as defined above in the "Background of the Invention" section) incorporating a conventional (non-special) sputter target. Such a sputter source is manufactured and sold by Varian Associates, Inc. under the trademark "S-Gun," and is described in detail in aforementioned U.S. Pat. No. 4,100,055 to Rainey.

In FIG. 1a, a central anode 10 of nonmagnetic material, such as copper, is surrounded by a ring member 12. The ring member 12 is held at a negative potential relative to anode 10 during operation of the sputter coating source, and thus is aptly termed a cathode. Ring member 12 also forms a target for bombardment by ions from the glow discharge, and thus is also referred to as a sputter target, or simply as a target. Accordingly, ring member 12 in FIG. 1a is referred to in various places herein alternatively as ring member, ring, cathode, sputter target, or target. Anode 10 is mounted on an anode post 15, which is nonmagnetic and is preferably made of copper. Anode post 15 has an internal cooling cavity 20 through which water circulates via conduits 21. Anode post 15 is mounted, either conductively or insulatively, on a nonmagnetic base plate 29 by means of a flange 23.

Target 12 is made of the material to be sputter-deposited from the sputter coating source onto the workpiece or substrate (not shown). For conventional target materials, target 12 has an uneroded sputter surface 13 of generally inverted conical configuration, and a side wall 14 of generally cylindrical configuration. Target 12 is mounted on a lower magnetic pole piece 42, and is surrounded by a nonmagnetic water jacket 44 having a cooled wall 46 of generally cylindrical configuration. Clamping ring 65 is optionally provided to secure target 12 to pole piece 42. Target 12 and water jacket 44 are so dimensioned that room temperature clearance between target side wall 14 and cooled wall 46 is sufficient to allow easy installation and removal of target 12, yet small enough to provide adequate thermal contact between target side wall 14 and cooled wall 46 for target cooling when target 12 expands upon being heated during normal operation. Water jacket 44 has an internal water channel 45 through which coolant, preferably water, is circulated via conduits 50. Conduits 50 are secured to base plate 29 by means of flanges 55. Electrical isolation between base plate 29 and conduits 50 is achieved by making conduits 50 of electrically nonconducting materials. Additional support means (not shown) are employed to ensure that the desired spacing between lower pole piece 42 and base plate 29 is maintained.

The main magnetic field is provided by a first plurality of bar magnets 28 (made, for example, of vacuum-compatible permanent magnet material such as Alnico 8) arrayed annularly between lower magnetic pole piece 42 and an upper magnetic pole piece 72. A second plurality of bar magnets 28' is arrayed annularly above pole piece 72 and in magnetic opposition (or in a bucking magnetic field arrangement) to the main magnetic field. The principal purpose of the bucking magnetic field arrangement is to suppress stray glow discharges in the region above upper pole piece 72. A nonmagnetic cylinder 30 defines the outer limits for accurately locating magnets 28 and 28' with respect to pole pieces 42 and 72, and a nonmagnetic ring 76 serves to further suppress stray glow discharges above pole piece 72. The arrangement described above results in magnetic field lines 95, some of which arch above sputter surface 13 of target 12 to form a magnetic tunnel for confining the glow discharge.

Further surrounding target 12, but electrically isolated therefrom, is a generally cylindrical and nonmagnetic outer housing 70 comprising outer ground shield member 73 conductively attached to base plate 29, and separable inner ground shield member 80.

In the example of FIG. 1a, a cathode assembly 98 is defined to include those members held together and operated at a common negative potential with respect to anode 10. Cathode assembly 98 thus includes target 12, magnets 28 and 28', cylinder 30, pole pieces 42 and 72, water jacket 44, conduits 50, clamping ring 65, and ring 76. As noted above, target 12 is easily installed and removed. If target 12 were bonded to water jacket 44 by soldering, for example, target replacement would be very difficult indeed.

Figure 1B:
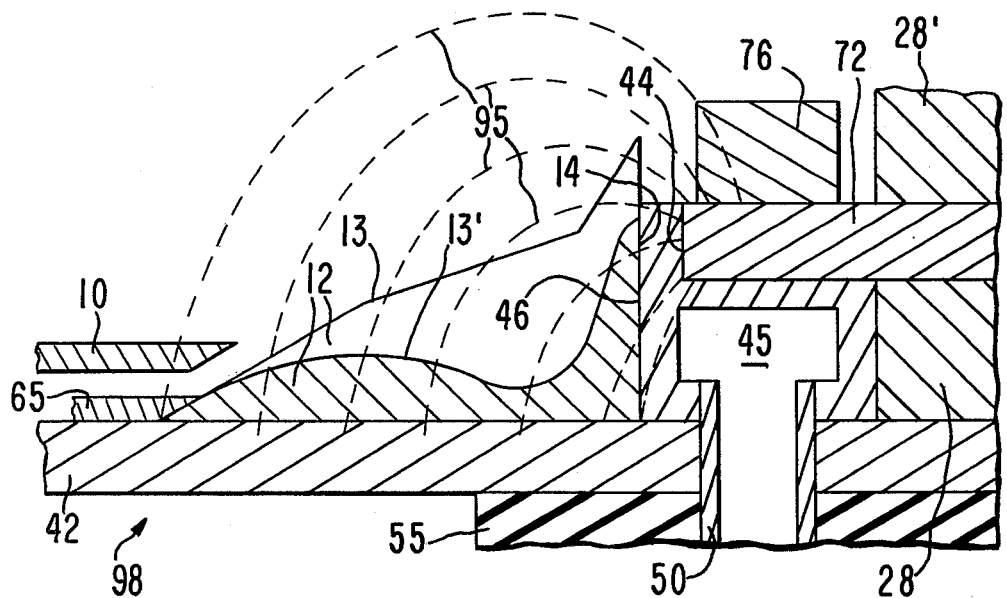
FIG. 1b is an enlarged fragmentary section of the sputter coating source of FIG. 1a showing target profiles, magnetic field lines, and cooled wall of the cathode assembly in greater detail.

FIG. 1b is an enlarged fragmentary section of the sputter coating source of FIG. 1a. Shown in further detail are portions of anode 10 and cathode assembly 98, including target 12, side wall 14, water jacket 44, water channel 45, cooled wall 46, conduits 50, magnetic pole pieces 42 and 72, optional clamping ring 65, magnets 28 and 28', ring 76, and magnetic field lines 95. Also shown are profiles of uneroded sputter surface 13 and an end-of-useful-life sputter surface 13'.

In typical operation, the chamber in which the sputter coating source is mounted is evacuated to a pressure on the order of $10^{-6}$ Torr. The chamber is then backfilled with a sputter gas, which is typically argon, to a pressure in the range 0.1 to 100 m Torr. Outer housing 70, base plate 29, and anode 10 are normally held at ground potential (although anode 10 may be biased slightly above ground potential in some applications), and a potential in the range $-350$ to $-1000$ volts with respect to ground is applied to target 12, which serves also as the cathode of the sputter coating source. The particular voltage required depends on such details as anode and target geometries, magnetic field shapes and intensities, target material, sputter gas species and pressure, and the desired discharge current.

FIG. 2a is a partial section of said second example of a prior art sputter coating source of the second type incorporating a conventional sputter target. Such a sputter source is manufactured and sold by Varian Associates, Inc. under the trademark "Conmag", and is described in detail in the aforementioned co-pending U.S. Patent Application Ser. No. 150,532. In a sputter coating source of cylindrically symmetric geometry, a circular central anode 110 is surrounded by a ring member or sputter target 112 having an uneroded sputter surface 113 of generally inverted conical configuration, and a side wall 114 of generally cylindrical configuration. Target 112 is held at a negative potential with respect to anode 110 during operation of the sputter coating source, and thus is also referred to as a cathode.

Anode 110 serves both as an electric field-forming electrode and as one end of the magnetic field-forming circuit. More specifically, anode 110 comprises a magnetic pole piece 115 and, in order to facilitate insertion and removal of the target (as will be hereinafter described in detail), pole piece 115 preferably includes a removable annular ring portion 116. Also, a removable thin anode surface sheet in the form of inverted cup 117 is held in place by screws 118 (not shown). Anode surface sheet 117 can be of magnetic or nonmagnetic material, but if nonmagnetic it should be sufficiently thin to preserve the desired magnetic field strength at the anode surface. An annular member 120, made of nonmagnetic material, is attached by means of bolts 121 to pole piece 115. An inner O-ring groove 122 allows a vacuum tight seal to be made between annular member 120 and pole piece 115. Annular member 120 also contains an outer O-ring groove 123 for sealing to the lower side of an electrical insulator ring 124 to insulate anode 110 from target 112. Anode 110 including pole piece 115 is cooled by passing coolant through a water channel 126 via coaxial conduits 127 and 128. An inverted cup-shaped magnetic member 130 is secured to pole piece 115 by means of bolts 131 (one shown). An O-ring groove 132 is provided in pole piece 115 to prevent coolant leakage between pole piece 115 and magnetic member 130. Annular magnets 133 provide the magnetic field for the magnetically enhanced sputter coating source. Alternatively, an annular electromagnet (not shown) may be used in combination with permanent magnets 133 to provide an electrically controllable portion of the magnetic field. Such electrical control of the magnetic field can be used to adjust the electrical impedance of the glow discharge, whereby, for example, changes in discharge impedance with cathode erosion can be compensated. In addition, a temporary increase in magnetic field can be advantageously used to trigger discharge initiation. Magnets 133 are placed on a magnetic base plate 134, onto which they are held by magnetic attraction. Adequate centering of magnets 133 is achieved through the use of a nonmagnetic cylinder 135 secured to flange 136, which is secured in turn to base plate 134 by screws 137 (one shown). A magnetic ring 138 is placed between magnetic member 130 and the upper one of magnets 133. Magnetic members 130 and 138 and magnets 133 are held together by magnetic attraction.

Target 112 is secured to a nonmagnetic annular base member 140. Target 112 is also surrounded by a nonmagnetic water jacket 141 having a cooled wall 146 of generally cylindrical configuration. Target 112 and water jacket 141 are so dimensioned that room temperature clearance between target side wall 114 and cooled wall 146 is large enough to allow easy installation and removal of target 112, yet small enough to provide adequate thermal contact between target side wall 114 and cooled wall 146 for target cooling when target 112 expands upon heating during normal operation. Water jacket 141 is secured mechanically to base member 140 by means of a nonmagnetic ring member 142 held by screws 143 (one shown). Water jacket 141 has internal water channels 145 through which coolant, preferably water, is circulated via conduits 150 (one shown). Conduits 150 are brazed in sleeves 151 which are brazed in base member 140 to provide vacuum-tight joints between conduits 150 and base member 140. Conduits 150 also comprise conventional detachable compression fittings 152 and 153 plus a bellows member 154, which is employed to reduce mechanical stress on the vacuum-tight joints of conduits 150 to base member 140. Direct cooling of base member 140 is provided by water channel 156 through which coolant is circulated via conduits 157 (one shown). This cooling is of particular importance in preserving the vacuum integrity of the O-ring in an O-ring sealing groove 158 for sealing the upper side of anode insulator 124. Base member 140 also contains an O-ring sealing groove 155 for sealing to the lower side of an electrical insulator ring 159 for the target. Finally, base member 140 has secured to it, by tack welding for example, a target retainer ring 160. A shield ring 161 has an outer lip portion which is sandwiched between the top of retainer ring 160 and target 112. The purpose of shield 161 is to reduce undesired coating of anode insulator 124 during sputter coating source operation. Retainer ring 160 contains a plurality of threaded holes, and shield 161 contains a plurality of corresponding clearance holes which are brought into registry during assembly.

Target 112 contains an inner rim portion 162 including an annular groove having angled wall 163 which makes an acute angle of about 60° with the bottom surface 164 of target 112. The threaded holes in retaining ring 160 engage threaded members 165 (one shown), which may be dog-point set screws, for example, or, alternatively, special screws incorporating spring-loaded ball plungers. Tightening threaded members 165 against angled wall 163 by inserting a tool through holes in shield ring 161 provides positive retention of target 112 upon normal installation at room temperature. When target 112 expands upon heating during normal operation, it may expand away from threaded members 165. However, acutely angled wall 163 in cooperation with threaded members 165 serve to prevent target 112 from falling a significant distance away from base member 140 in case the sputter coating source is operated in an inverted position, for example. More-over, thermal expansion of target 112 during normal operation holds it securely in water jacket 141. Replacement of target 112 is accomplished by removing anode surface sheet 117 and annular ring portion 116 from pole piece 115, and then unscrewing threaded members 165 enough to release target 112, which in turn releases shield ring 161 which is simply held in place by the presence of target 112.

In the example of FIG. 2a, a cathode assembly 198 is defined to include those members held together and operated at a common negative potential with respect to anode 110. Cathode assembly 198 thus includes target 112, base member 140, water jacket 141, ring 142, conduits 150 and 157, retainer ring 160, and shield 161. As noted above, target 112 is removed and installed in a straightforward manner. If target 112 were bonded to water jacket 141 by soldering, for example, target replacement would be far more difficult.

A housing 170 for the anode-target assembly comprises a lower ring member 171 and an outer magnetic pole piece ring 172 joined together in vacuum-tight fashion by a cylindrical wall member 173. Members 171 and 173 are made of ferromagnetic material, such as cold rolled steel, to provide portions of the required magnetic path to pole piece 172. Lower ring member 171 contains O-ring sealing groove 174 to facilitate demountable and vacuum-tight installation of the sputter coating source of FIG. 2a in the wall of the vacuum chamber (not shown) so that the sputter coating source projects from the chamber wall into the chamber. Pole piece 172 also contains O-ring sealing groove 177 to allow a vacuum-tight seal to be made to the upper side of target insulator 159. A concentric pair of cylindrical flashover insulators 178 and 179 is provided to prevent arcing to wall member 173 during sputter coating source operation. Removably attached (attachment means not shown) to outer pole piece 172 are nonmagnetic ground shield members 180 and 181, with water cooled nonmagnetic member 182 positioned between the two ground shields and cooled via water flowing through attached conduit 183. Ground shield 180 serves particularly to reduce undesired coating of target insulator 159 during sputter coating source operation.

The overall assembly of the sputter coating source of FIG. 2a is held together by means of clamping ring member 190. Bolts (not shown) draw clamping ring member 190 toward lower ring member 171 by passing through hole 191 and engaging threads in hole 192. In so doing, clamping ring member 190 forces base plate 134 upward, thereby effecting vacuum-tight seals by compressing O-rings in O-ring sealing grooves 123 and 158 on the lower and upper sides respectively of anode insulator 124, and also by compressing O-rings in O-ring sealing grooves 155 and 177 on the lower and upper sides respectively of target insulator 159.

The magnetic circuit design as described above, including particularly the geometries of central anode 110, central magnetic pole piece 115, and outer magnetic pole piece 172, results in magnetic field lines 195. Magnetic field lines 195 are shown more clearly and in greater detail in FIG. 2b, which is an enlarged fragmentary section of the sputter coating source of FIG. 2a. It should be noted that the arching magnetic field lines above uneroded sputter surface 113 do not loop through sputter surface 113, as they do in many other prior art sputter coating sources. Rather, those magnetic field lines which do pass through sputter surface 113 go directly to anode 110 rather than passing a second time through sputter surface 113. As described in aforementioned co-pending U.S. Patent Application Ser. No. 150,532, electron reflection from anode 110 back into the glow discharge occurs due to magnetic mirroring with this particular magnetic field configuration. A modified magnetic tunnel is thus formed in which electrons are reflected electrostatically from sputter surface 113 near the outer edge of target 112, and reflected by magnetic mirroring near the inner edge of target 112. It has been established that use of this modified magnetic tunnel leads to improved electrical impedance characteristics of the glow discharge and to improved uniformity in erosion of target 112. An end-of-useful-life target profile is shown as sputter surface 113' in FIG. 2b.

Figure 2B:
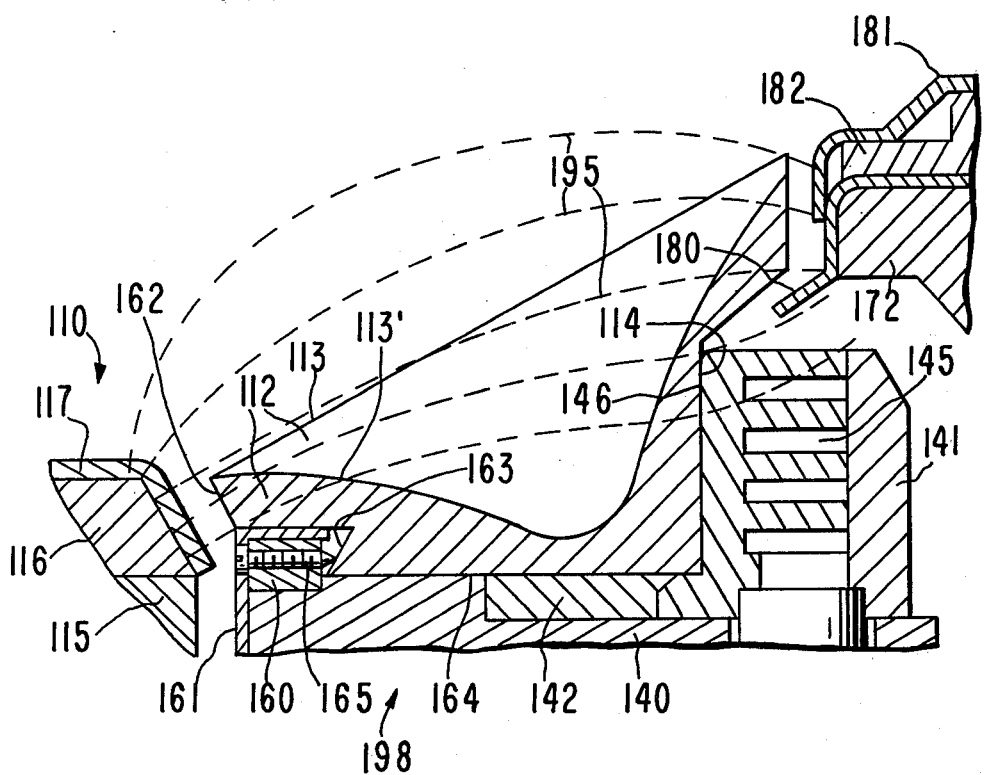
FIG. 2b is an enlarged fragmentary section of the sputter coating source of FIG. 2a showing target profiles, magnetic field lines, and cooled wall of the cathode assembly in greater detail.

Also shown in FIG. 2b in further detail are portions of anode 110, target 112, side wall 114, base member 140, water jacket 141, ring 142, water channel 145, cooled wall 146, retainer ring 160, shield 161, inner rim portion 162, angled wall 163, bottom surface 164, threaded member 165, pole piece 172, ground shields 180 and 181, and member 182.

Typical operation of the sputter coating source of FIG. 2a is similar to that described earlier for the sputter coating source of FIG. 1a.

FIG. 3a is a section of one embodiment of a sputter target assembly of the present invention for use in the sputter coating source of FIG. 1a. A sputter target assembly 203 comprises a retaining cup 211, a target portion 212 of a fragile or other special material to be sputtered, and a bonding means 215. Sputter target assembly 203 may also be aptly referred to as a cathode subassembly.

FIG. 3c is an enlarged fragmentary section of sputter target assembly 203 incorporated in the sputter coating source of FIG. 1a. In cathode assembly 298, target assembly 203 corresponds to target 12 in cathode assembly 98 of FIGS. 1a and 1b. Target portion 212 is composed of the fragile or other special target material to be sputtered. Portion 212 has an uneroded surface profile 213 which is essentially the same as profile 13 of conventional sputter target 12.

Retaining cup 211 consists of an outer ring portion 221 and a bottom plate portion 222. Ring 221 and plate 222 may be made as a single piece (as shown), or they may be made as separate pieces. Ring 221 has an outer side wall 224 which interfaces with cooled wall 46. Retaining cup 211 is so dimensioned relative to water jacket 44 that room temperature clearance between side wall 224 and cooled wall 46 is sufficient to allow easy installation and removal of target assembly 203, yet small enough to provide adequate thermal contact between side wall 224 and cooled wall 46 for cooling special target portion 212 when target assembly 203 expands upon being heated during normal operation. Retaining cup 211 is made of a non-fragile material having both good thermal conductivity and a sufficiently high coefficient of thermal expansion that intimate thermal contact between side wall 224 and cooled wall 46 is made when target assembly 203 is heated during normal operation. Copper is typically, though not exclusively, the material of choice for retaining cup 211.

Since the material of which retaining cup 211 is made is in general different from that of special target portion 212, it is important that sputtering from retaining cup 211 be avoided in the interest of not contaminating the sputtered coatings with retaining cup material. Examination of end-of-useful-life sputter surface profile 13'

(FIG. 1b) of conventional sputter target 12 provides guidance in configuring retaining cup 211.

To avoid sputtering from outer ring 221 without unduly limiting the useful life of special target portion 212, it is important that ring 221 be as short and as thin as possible, consistent with the need for retaining cup 211 to protect and cool the fragile or other special material of portion 212. A useful parameter in specifying ring 221 is a dimension 231 defined as the shortest distance between ring 221 and uneroded surface 213 of portion 212. For a sputter target assembly 203 of outside diameter 5.157 inches (131.0 mm) and maximum height 0.88 inches (22.4 mm), it has been found that a particularly useful value for dimension 231 is 0.125 inches (3.2 mm). Also, in this particular example a value of 0.041 inches (1.04 mm) was used for the thickness of ring 221 and a value of 0.030 inches (0.76 mm) was used for the thickness of bottom plate 222.

To avoid sputtering from bottom plate 222 without unduly limiting the useful life of special target portion 212, it is important that plate 222 be reasonably thin. It is noted, however, that little if any net sputtering occurs near the inner radius of conventional sputter target 12. In consequence, plate 222 may extend radially inward as far as desired without posing a contamination hazard. In the embodiment shown, bottom plate 222 extends radially inward beyond special target portion 212. Tapered inner edge 226 of plate 222 serves as the interface with optional clamping ring 65. In this way, any attachment stresses are borne by retaining cup 211 rather than by the fragile or other special material of portion 212.

Except for tapered edge 226, plate 222 and ring 221 are shown as being of generally uniform cross section. Under certain circumstances it may be worthwhile to extend the useful life of special target portion 212 by configuring retaining cup 211 to conform even more closely to end-of-useful-life profile 13' of conventional sputter target 12.

Surrounding fragile or other special target portion 212 as it does, retaining cup 211 confers a significant added margin of safety in the handling and transporting of target portion 212, as well as during insertion into cooled wall 46 of cathode assembly 298.

Bonding means 215 employed in the embodiment of FIG. 3a serves to secure the fragile or other special target material of portion 212 to outer ring 211 of retaining cup 211, and optionally to secure portion 212 to bottom plate 222 to prevent dislodgement of cracked pieces. Bonding means 215 must provide good thermal conductivity in order that the heat produced in portion 212 may be conducted to outer ring 221 and through side wall 224 into cooled wall 46 of water jacket 44. In addition, bonding means 215 may need to accommodate differences in coefficients of thermal expansion of portion 212 and retaining cup 211. Also, bonding means 215 must be compatible with portion 212, with retaining cup 211, and with vacuum sputter coating generally. Examples of useful bonding means include indium, indium-tin alloys, lead-tin alloys, silver-copper alloys, and silver-epoxy mixtures. Also, where the specific fragile material of portion 212 and the material of retaining cup 211 form a suitable alloy upon heating during manufacture of target assembly 203, such common alloy can form bonding means 215 without the use of separate alloys or epoxy mixture mentioned above. An overall consideration is that bonding means 215 and outer ring 221 together form a good thermal path from the fragile material of portion 212 to cooled wall 46 of cathode assembly 298, and that bonding means 215 and outer ring 221 form a relatively "soft" or "yieldable" combination in order to reduce stresses in the fragile material. The "soft" or "yieldable" characteristic of copper makes it a particularly useful material for outer ring 221.

In one example of target assembly 203 made in accordance with the invention, the fragile material of portion 212 is silicon doped with phosphorous; the material of retaining cup 211 is copper; and bonding means 215 is a silver-epoxy mixture. In another example, the fragile material of portion 212 is graphite; the material of retaining cup 211 is copper; and bonding means 215 is a silver-epoxy mixture. In all cases the bond is formed prior to shipping of completed target assembly 203.

FIG. 3b is a section of an alternative embodiment of the sputter target assembly of the present invention for use in the sputter coating source of FIG. 1a. A sputter target assembly 303 comprises a retaining cup 311, a special target portion 312, and a bonding means 315. The main difference between the embodiments of FIGS. 3a and 3b lies in the respective uneroded sputter surface profiles 213 and 313. The simpler profile 313 renders target portion 312 easier and less costly to fabricate than target portion 212, but the useful target life is lower. The various elements in FIG. 3b are given 300-series numbers which correspond to the 200-series numbers of FIG. 3a.

Figure 4A:
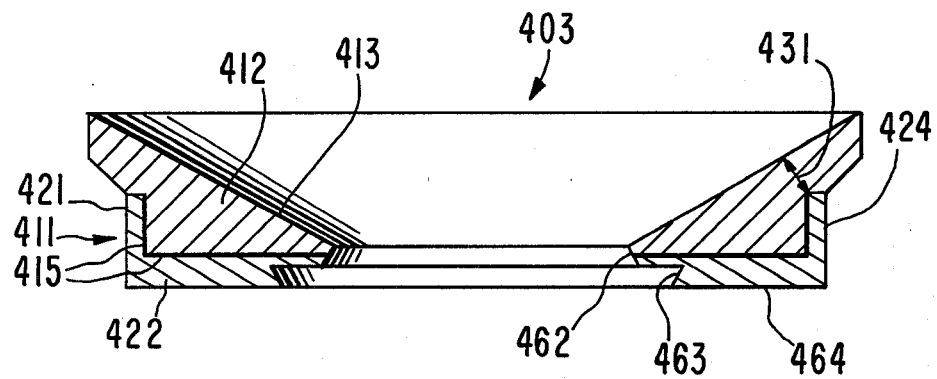
Figure 4B:
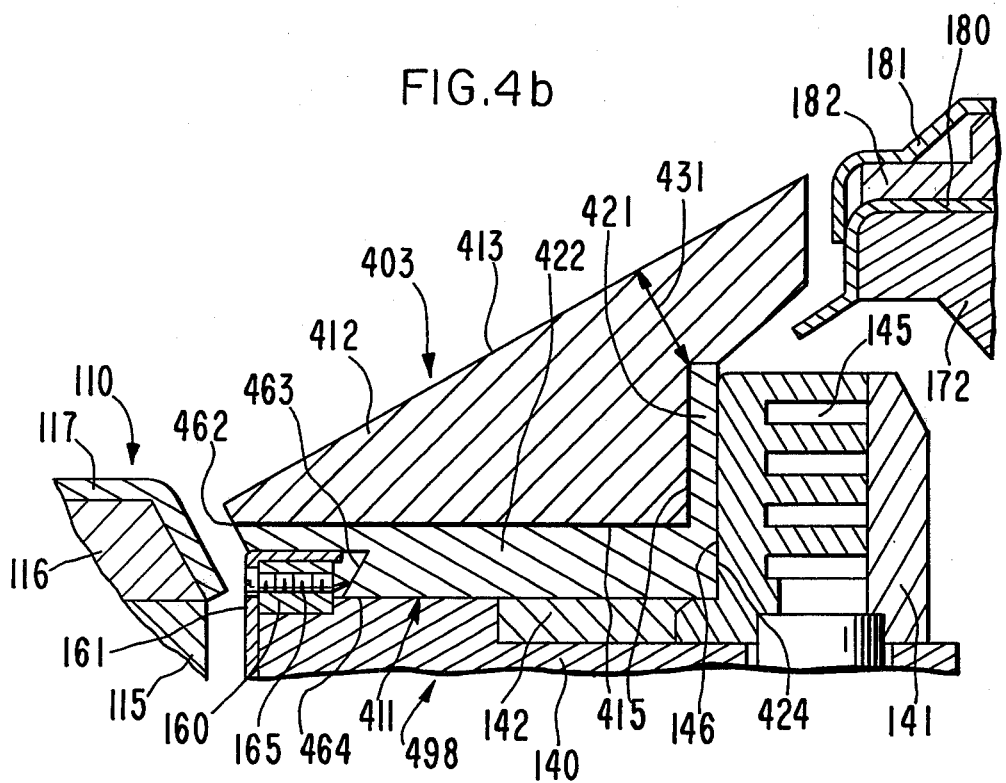

FIG. 4a is a section of one embodiment of a sputter target assembly of the present invention for use in the sputter coating source of FIG. 2a. A sputter target assembly 403 comprises a retaining cup 411, a fragile or other special target portion 412, and a bonding means 415. FIG. 4b is an enlarged fragmentary section of sputter target assembly 403 incorporated in the sputter coating source of FIG. 2a. In cathode assembly 498, target assembly 403 corresponds to target 112 in cathode assembly 198 of FIGS. 2a and 2b.

Portion 412 is composed of the fragile or other special target material to be sputtered, and has an uneroded surface profile 413 which is essentially the same as profile 113 of target 112. Retaining cup 411 consists of an outer ring portion 421 and a bottom plate portion 422. As in the case of FIGS. 3a, b and c, the ring and plate portions may be formed from separate pieces. Ring 421 has an outer side wall 424 which interfaces with cooled wall 146. Retaining cup 411 is so dimensioned relative to water jacket 141 that room temperature clearance between side wall 424 and cooled wall 146 is sufficient to allow easy installation and removal of target assembly 403, yet small enough to provide adequate thermal contact between side wall 424 and cooled wall 146 for cooling target portion 412 when target assembly 403 expands due to the heat of normal operation. Considerations regarding the choice of material for retaining cup 411 are the same as discussed above relative to retaining cup 211 of FIGS. 3a and 3c.

Also as discussed above in connection with retaining cup 211, it is important that sputtering from retaining cup 411 be avoided. Examination of end-of-useful-life sputter surface profile 113' (FIG. 2b) of conventional sputter target 112 provides guidance in configuring retaining cup 411. To avoid sputtering from outer ring 421 without unduly limiting the useful life of special target portion 412, it is important that ring 421 be as short and as thin as possible, consistent with the need for retaining cup 411 to protect and cool the fragile or other special material of portion 412. A useful parameter in specifying ring 421 is a dimension 431 defined as the shortest distance between ring 421 and uneroded surface 413 of portion 412. For a sputter target assembly 403 of outside diameter 7.00 inches (177.8 mm) and maximum height 1.31 inches (33.3 mm), it has been found that a particularly useful minimum value for dimension 431 is 0.33 inches (8.4 mm). Also, in this particular example, a value of 0.050 inches (1.27 mm) was used for the thickness of ring 421 and a value of 0.200 inches (5.08 mm) was used for the thickness of bottom plate 422.

In this embodiment of the invention, bottom plate 422 plays an important role in securing target assembly 403 to base member 140. Plate 422 is made thick enough to accommodate retaining ring 160 and shield ring 161, and to provide an angled surface 463 against which threaded members 165 may be tightened. By virtue of this arrangement, attachment stresses are borne by retaining cup 411 rather than by the fragile or other special material of portion 412.

Except for a tapered edge 462 and angled surface 463, plate 422 and ring 421 are shown as being substantially uniform in cross section. Under certain circumstances it may be worthwhile to extend the useful life of sputter target 412 by configuring retaining cup 411 to conform even more closely to end-of-useful-life profile 113' of conventional sputter target 112.

Figure 5:
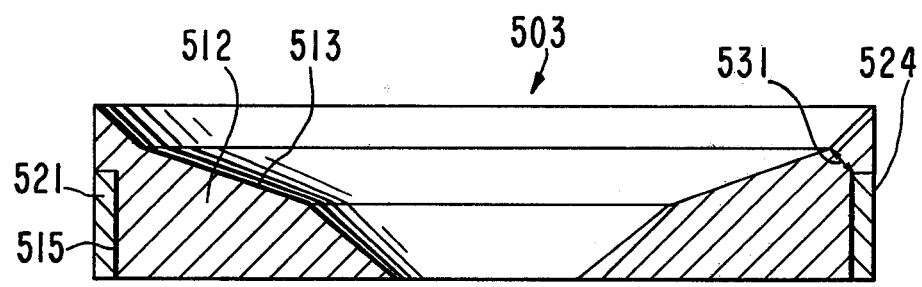

In certain situations, particularly with special materials which have very low coefficients of thermal expansion, it has been found that cracking does not present a major problem. In particular, one of the major causes of cracking is not present; there are no large dimensional excursions due to thermal expansion and contraction. With such special materials, there is no need for the bottom plate portions 222, 322, and 422 in FIGS. 3a, 3b and 4a, respectively. In other words, the special material need not be bonded to a bottom plate portion to prevent dislodgement of cracked pieces. With a too-low coefficient of thermal expansion, such special materials will not expand into highly compressed contact with the cooled wall of the cathode assembly, and hence will not be adequately cooled. It is therefore necessary to employ a retaining member which at least includes the appropriate outer ring portion 221, 321, or 421 of FIGS. 3a, 3b, or 4a. FIG. 5 is a section of an embodiment of the target assembly configuration of FIG. 3a employing only an outer retaining member in the form of a ring or band. More specifically, FIG. 5 discloses a sputter target assembly 503 comprising a retaining ring or band 521, a special target portion 512, and a bonding means 515. The uneroded sputter surface profile 513 of special target portion 512 is the same as profile 213 in FIG. 3a. As distinguished from FIG. 3a, however, bottom plate portion 222 of FIG. 3a is omitted and the bottom side of special target portion 512 extends downwardly to be flush with the bottom of retaining ring or band 521. The outer perimeter or sidewall 524 of band 521 is dimensioned to fit properly within the cooled wall 46 of the cathode assembly as discussed in connection with FIG. 3c. When the target assembly of FIG. 5 is inserted in the cathode assembly of FIG. 3c, the special material of target portion 512 rests on the upper surface of member 42 in FIG. 3c, and the uneroded profile 513 of FIG. 5 occupies the same position as shown for uneroded surface 213 in FIG. 3c. Also the dimension 531 is selected in accordance with the teachings in respect to dimension 231 discussed in connection with FIG. 3a.

Bonding means 515 can be any of the bonding menas discussed in respect to FIG. 3a. In addition, bonding means 515 can take the form of a shrink fit between the inner wall of band 521 and the adjacent outer periphery of special target portion 512 by heating band 521 and placing it in a thus expanded condition around special target portion 512, and allowing the assembly to cool and thus create an intimate thermally conductive and holding connection between the special target material and the band. The heated temperature of the band is preferably above the temperature which will be experienced in normal operation of the target assembly in the sputter coating source so that the tight thermal contact between the band and the special target material will be assured throughout normal operation of the target assembly. The shrink-fit bonding means is particularly useful with target materials which have such a low coefficient of expansion that the retaining ring 521 and alloy or epoxy type bonds will tend to expand away from the target material so much as to unacceptably reduce the necessary thermal and holding connection. The shrink-fit bond alleviates this problem because the shrunk ring retains residual contact stress at its inner side as its outer side moves outwardly. In respect to some fragile or other special materials, this shrink-fit type of bonding may be employed in the embodiments of FIGS. 3a, 3b, and 4a, with or without the addition of one of the other aforementioned bonding means between the bottom side of the fragile material and the bottom plate.

Figure 6:
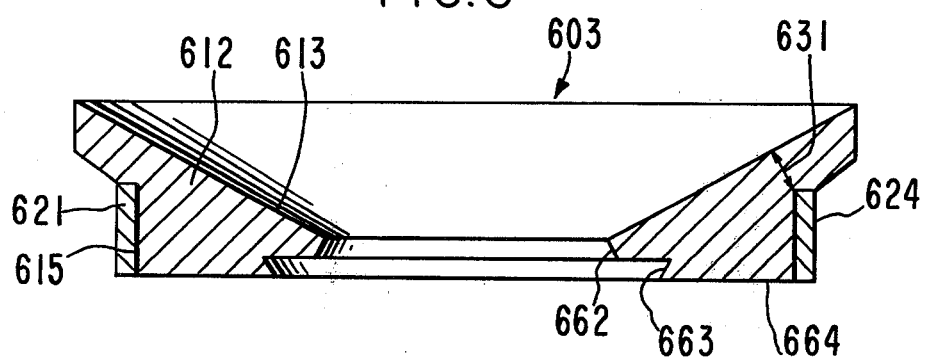

FIG. 6 is a section of an embodiment of the target assembly configuration of FIG. 4a employing only an outer ring or band as the retaining member. More specifically, FIG. 6 discloses a sputter target assembly 603 comprising a retaining band 621, a special target portion 612, and a bonding means 615. The uneroded surface profile 613 of special target portion 612 is the same as profile 613 in FIG. 4a. As distinguished from FIG. 4a, however, bottom plate portion 422 of FIG. 4a is omitted and the bottom side of special target portion 612 extends downwardly to be flush with the bottom of retaining band 621. The outer perimeter or sidewall 624 of band 621 is dimensioned to fit properly within cooled wall 146 of the cathode assembly as discussed in connection with FIG. 4b. When the target assembly of FIG. 6 is inserted in the cathode assembly of FIG. 4b, the special material of target portion 612 rests on the upper surfaces of base member 140 and ring 142 of FIG. 4b. As shown in FIG. 6, special target portion 612 contains an inner rim portion 662 including an annular groove having an angled wall 663 which makes an acute angle of about 60° with the bottom surface 664 of special target portion 612. Acutely angled wall 663 corresponds to angled wall 163 of FIGS. 2a and 2b. The role of angled wall 163 in positive retention of target 112 was discussed in connection with FIGS. 1a and 2a. Uneroded profile 613 of FIG. 6 occupies the same position as shown for uneroded surface 413 in FIG. 4b. Also, the dimensions of band 621 and the dimension 631 are selected in accordance with the teachings in respect to ring 421 and dimension 431 discussed in connection with FIG. 4a. Bonding means 615 can be any of the bonding means discussed in respect to FIGS. 3a and FIG. 5, including especially the shrink-fit type of bond discussed for bonding means 515 of FIG. 5.

In one example of target assembly 603 made in accordance with the invention, special target portion 612 is tantalum disilicide; retaining band 621 is copper; and bonding means 615 is the above-described shrink-fit. In the specific example shown in FIG. 6, copper band 621 is 0.500 inches (12.7 mm) in length and has a wall thickness of 0.061 inches (1.55 mm).

When sputter targets are made of special materials having too-high coefficients of thermal expansion, high compressive forces within the target and high tensile forces in the cooled wall will develop during thermal expansion of the sidewall of the target against the cooled wall of the cathode assembly. If the target material is weak mechanically, it is likely to be broken or crushed by the high compressive forces. If the target material is very hard and strong mechanically, the tensile forces transmitted to the cooled wall of the cathode assembly may cause deformation or rupture of the cooled wall. Such rupture would likely result in a catastrophic water leak into the vacuum system.

The above-described problems arising from a special target material having a too-high coefficient of thermal expansion may be solved using the novel design approach of the present invention. In general, the various embodiments already described employ a sputter target assembly comprising the special target material to be sputtered, a retaining member, and a bonding means. In one solution to the problems arising from a too-high thermal expansion coefficient, one of the embodiments described in connection with FIGS. 3–6 is employed in which the bonding means is chosen to provide a thermal connection with sufficient resilience to accommodate the too-high coefficient of expansion of the special target material.

The novel design approach of the present invention is particularly shown in FIGS. 3, 4, 5 and 6 and the associated description and discussion. These embodiments show how the various objects of the invention are realized.

While the invention has been described with reference to specific arrangements of parts, the description and accompanying drawings are illustrative of the invention and are not to be construed as limiting the invention. Various modifications and applications may occur to those skilled in the art without departing from the true spirit and scope of the invention as disclosed in the above description and as defined by the appended claims.

What is claimed is:

1. A sputter target assembly for use in sputter coating sources of the type having a cooled wall against which a sputter target expands for cooling the target material, said sputter target assembly comprising:
    an annular sputter target made of a special material to be sputtered;
    said sputter target having an outer wall of substantial height;
    a retaining member comprising a retaining band surrounding said outer wall of said sputter target;
    said retaining band being of a different material than said sputter target; and
    a thermally conductive and physically confining bonding means between said retaining band and said outer wall of said sputter target.

2. The sputter target assembly of claim 1 wherein said retaining band is so configured that sputtering therefrom is avoided over substantially all of the useful life of said sputter target.

3. The sputter target assembly of claim 1 wherein said bonding means is a silver-epoxy mixture.

4. The sputter target assembly of claim 1 wherein said retaining band is of a material of sufficiently high thermal conductivity to allow said special sputter target material to be cooled by heat flow through said retaining band to said cooled wall.

5. The sputter target assembly of claim 1 wherein said retaining band is of a material of sufficiently high thermal expansion coefficient to allow said retaining band to expand into tight contact with said cooled wall when said sputter target is heated in normal operation of said sputter coating source.

6. The sputter target assembly of claim 1 wherein said special sputter target material has a thermal expansion coefficient less than that of said retaining band.

7. The sputter target assembly of claims 1 or 6 wherein said bonding means is a shrink-fit bonding means.

8. A sputter target assembly for use in sputter coating sources of the type having a cooled wall against which a sputter target expands for cooling the target material, said sputter target assembly comprising:
    an annular sputter target made of a special material to be sputtered;
    said sputter target having a cylindrical outer wall of substantial height and a generally planar bottom portion;
    a retaining member comprising an outer ring portion and a bottom plate portion, said outer ring portion surrounding said outer wall of said sputter target, and said bottom plate portion interfacing with said planar bottom portion of said sputter target;
    said retaining member being of a different material than said sputter target; and
    a bonding means between said retaining member and said sputter target.

9. The sputter target assembly of claim 8 wherein said retaining member is so configured that sputtering therefrom is avoided over substantially all of the useful life of said sputter target.

10. The sputter target assembly of claim 8 wherein said special sputter target material is a fragile material.

11. The sputter target assembly of claim 10 wherein said bonding means provides a thermally conductive bond between said outer ring portion of said retaining member and said outer wall of said sputter target.

12. The sputter target assembly of claim 11 wherein said bonding means provides a physically confining bond between said outer ring portion of said retaining member and said outer wall of said sputter target.

13. The sputter target assembly of claim 12 wherein said bonding means provides a physically confining bond between said bottom plate portion of said retaining member and said planar bottom portion of said sputter target.

* * * * *